(12) United States Patent
Pueschner et al.

(10) Patent No.: US 9,224,695 B2
(45) Date of Patent: Dec. 29, 2015

(54) CHIP ARRANGEMENT AND A METHOD FOR MANUFACTURING A CHIP ARRANGEMENT

(71) Applicant: Infineon Technologies AG, Neubiberg (DE)

(72) Inventors: Frank Pueschner, Kelheim (DE); Juergen Hoegerl, Regensburg (DE); Roman Hollweck, Burglengenfeld (DE); Peter Scherl, Neunburg v.W. (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/779,832

(22) Filed: Feb. 28, 2013

(65) Prior Publication Data

US 2014/0239474 A1    Aug. 28, 2014

(51) Int. Cl.
| | |
|---|---|
| *H01L 23/00* | (2006.01) |
| *H01L 21/50* | (2006.01) |
| *H01L 23/31* | (2006.01) |
| *G06K 19/077* | (2006.01) |

(52) U.S. Cl.
CPC ........ *H01L 23/562* (2013.01); *G06K 19/07747* (2013.01); *G06K 19/07749* (2013.01); *H01L 21/50* (2013.01); *H01L 23/3121* (2013.01); *H01L 24/19* (2013.01); *H01L 2223/6677* (2013.01); *H01L 2224/04105* (2013.01); *H01L 2224/131* (2013.01); *H01L 2224/133* (2013.01); *H01L 2224/1329* (2013.01); *H01L 2224/16227* (2013.01); *H01L 2224/32225* (2013.01); *H01L 2224/32245* (2013.01); *H01L 2224/33181* (2013.01); *H01L 2224/73203* (2013.01); *H01L 2224/73204* (2013.01); *H01L 2224/73267* (2013.01); *H01L 2224/92144* (2013.01); *H01L 2224/94* (2013.01); *H01L 2924/1421* (2013.01); *H01L 2924/1434* (2013.01); *H01L 2924/15153* (2013.01)

(58) Field of Classification Search
CPC .................. G06K 19/07749; G06K 19/07728; G06K 19/07775; G06K 19/07779; G06K 19/072; G06K 19/077; G06K 19/0775; G06K 19/07794
USPC .................... 257/686; 235/492, 487, 375, 380
See application file for complete search history.

(56) References Cited

U.S. PATENT DOCUMENTS

| | | | |
|---|---|---|---|
| 6,572,021 B1 * | 6/2003 | Lippert ...................... 235/481 |
| 2005/0245001 A1 * | 11/2005 | Hyvonen et al. ............ 438/107 |
| 2006/0126480 A1 * | 6/2006 | Lindvold et al. .......... 369/275.1 |
| 2010/0248475 A1 * | 9/2010 | Mengel et al. ............. 438/669 |
| 2011/0073357 A1 * | 3/2011 | Zenz ............................ 174/257 |
| 2012/0024959 A1 * | 2/2012 | Minagawa et al. .......... 235/488 |
| 2012/0038445 A1 * | 2/2012 | Finn ........................... 336/105 |
| 2012/0040128 A1 * | 2/2012 | Finn ............................. 428/96 |
| 2012/0126840 A1 * | 5/2012 | Lee et al. ................... 324/750.3 |
| 2013/0140370 A1 * | 6/2013 | Finn ............................ 235/492 |
| 2013/0281169 A1 * | 10/2013 | Coverstone et al. ........ 455/575.8 |

* cited by examiner

*Primary Examiner* — Whitney T Moore

(57) ABSTRACT

In various embodiments a chip arrangement is provided, wherein the chip arrangement may include a chip and at least one foil attached to at least one side of the chip.

23 Claims, 13 Drawing Sheets

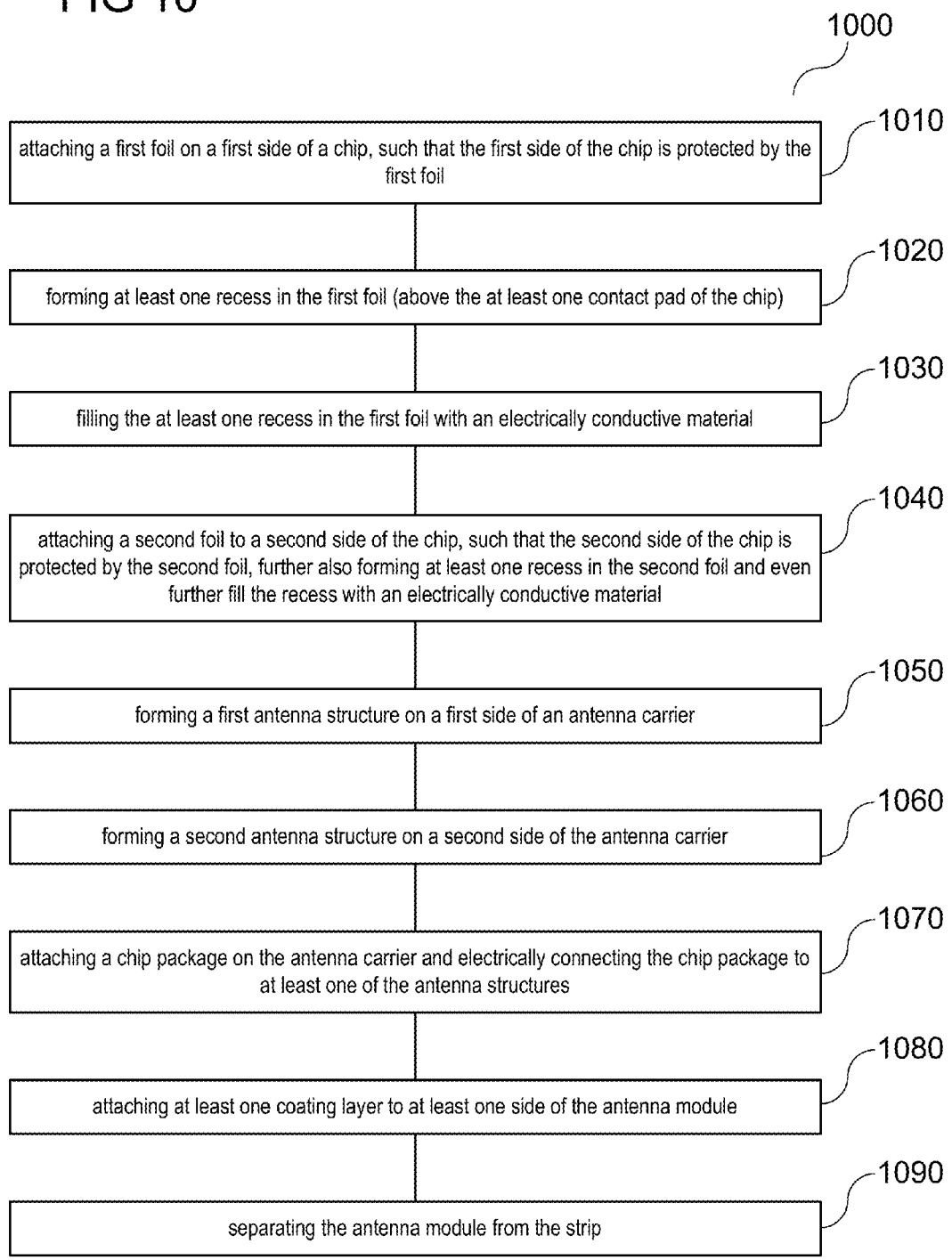

US 9,224,695 B2

CHIP ARRANGEMENT AND A METHOD FOR MANUFACTURING A CHIP ARRANGEMENT

TECHNICAL FIELD

Various embodiments relate generally to a chip arrangement; a chip card and to a method for manufacturing a chip arrangement.

BACKGROUND

In general, a chip or an integrated circuit may be very fragile and may be damaged or destroyed or may lose the functionality if a mechanical load is applied. Therefore, the chip may be supported by the chip package or other technical means to provide a rigid or stiff chip arrangement or chip package such that a required robustness is achieved for the chip package to protect the chip.

SUMMARY

In various embodiments a chip arrangement is provided, wherein the chip arrangement may include a chip and at least one foil attached to at least one side of the chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 10 shows a flow diagram of a method for manufacturing a chip arrangement, according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Figure 1:
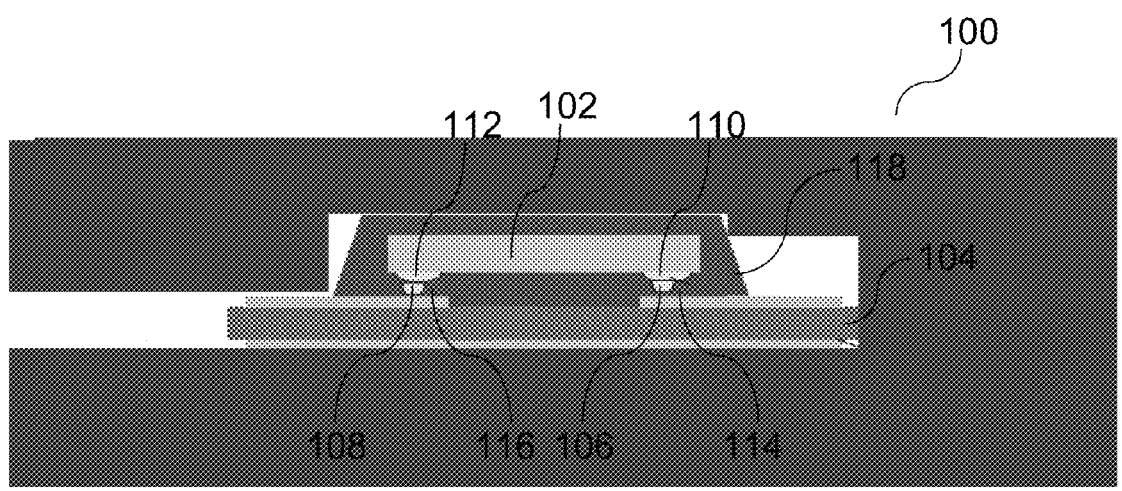
FIG. 1 shows a chip arrangement according to prior art.

FIG. 1 shows a cross sectional view of a conventional chip package 100. The chip package 100 includes a chip 102 mounted on a chip carrier 104. The chip carrier 104 includes a plurality of chip contacts 106, 108. The chip 102 is fixed to the chip contacts 106, 108 via stud bumps 110, 112 by means of electrically conductive glue or solder 114, 116. Moreover, the chip 102 is encapsulated by a mold material 118.

Figure 2:
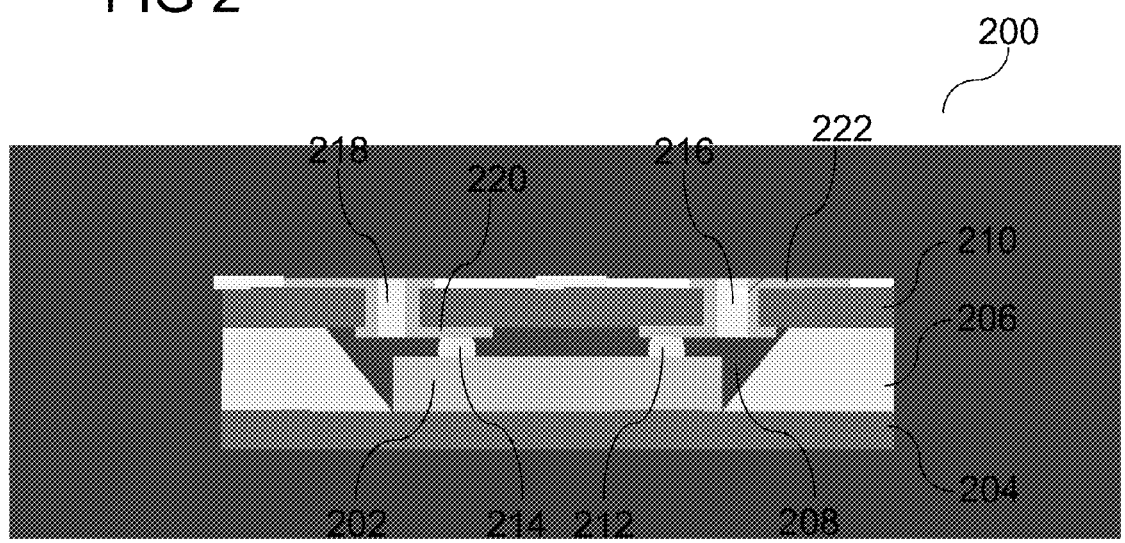
FIG. 2 shows a chip arrangement according to prior art.

FIG. 2 shows a cross sectional view of an alternative conventional chip package 200. The chip package 200 includes a chip 202 mounted in flip-chip technology within a recess of a layer 206 on a chip carrier 204. The chip 202 may be fixed by a die adhesive 208 in its position. The chip 202 is encapsulated by a laminate 210, wherein the laminate 210 may includes a plurality of e.g. two vias 216, 218, which may be filled with a conductive material and thus electrically connecting a metal layer 220 to a metal layer 222, and wherein a metal layer 220 may be connected to the chip 202 via the bumps 212, 214 such that the chip 202 can be electrically connected to an external device.

The development of chips trends to smaller sizes and structures by at least maintained properties in robustness and therefore reliability. The need for shrinking is driven by the objective of reducing costs per unit, e.g. by savings in material or reduction of clipping when cutting the wafer; in reducing power consumption due to smaller structures, and increasing the speed and functionality of the chip. These aims are contrary to the environment in which chip cards are used, where, e.g. when being carried in a wallet, the chip card and so the therein fixed chip are subjected to mechanical stress, which might cause breakage of the chip when being too small to resist, e.g. when not being flexible to withstand mechanical load.

Conventional chips as for example shown in FIG. 1 and FIG. 2 may be protected by additional materials to enforce a chip, e.g. by covering a chip with mold material or creating a chip package including several laminated layers encapsulating the chip. Using additional materials for conventional chip packages may lead to complex processing, e.g. due to the need for complex machinery and equipment, expensive basic materials, multiplicity of working steps, quality control and may be subject to restrictions like interaction of materials, e.g. in case of thermal expansion, etc.

As shown in the following, according to various embodiments, a chip arrangement may be provided, having an improved design, such that the chip arrangement may have an increased stability to mechanical loads. According to various embodiments, the chip arrangement, as described herein, may not have the disadvantages of the conventional chip packages 100, 200; conventional chip packages 100, 200 for example may include various materials, e.g. silicon, oxides, nitrides, metals, dielectric layers, mold material, and the like, and therefore, there may be problems due to the thermal expansion, or diffusion, or a limit in the material combinations, which may increase the processing costs (e.g. since expensive materials may be used). Further, the conventional processing may include various materials, material layer, adhesives, and the like such that manufacturing a thin package or chip arrangement or even an ultra-thin package or chip arrangement unattainable.

Using the conventional processing may not allow to fabricate flexible chip arrangements providing a sufficient stability to a mechanical load, as it may be for example necessary for the use of chips, electronic modules, or chip arrangement in so-called smart cards or chip cards.

According to various embodiments an alternative protection system device may be provided, including a chip in a robust module, which may allow the shrinkage of the chip arrangement or the chip package without losing robustness of the module.

Figure 3:
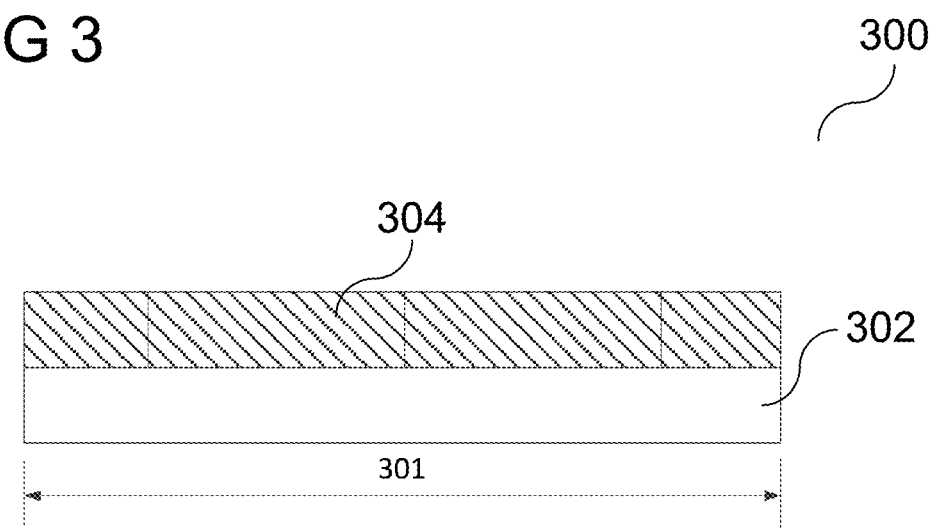
FIG. 3 shows a cross sectional view of a chip arrangement, according to various embodiments.

FIG. 3 shows a cross sectional view of a chip arrangement 300, according to various embodiments, avoiding the problems occurring in conventional chip packages as shown in FIG. 1 and FIG. 2. As shown in FIG. 3, according to various embodiments, a chip arrangement 300 may include a chip 302 and a foil 304, wherein the foil 304 may be attached to at least one side of the chip 302.

According to various embodiments, the chip 302 may include at least one of an integrated circuit, a complementary metal oxide semiconductor chip (CMOS chip), a memory chip, a radio-frequency identification chip (RFID chip), or any other desired chip fabricated on thin substrates. According to various embodiments, the chip 302 may have a lateral extension, e.g. along a direction 301 as shown in FIG. 3, in the range of about 1 mm to about 10 mm, e.g. about 2 mm to about 7 mm, e.g. about 3 mm to about 5 mm, e.g. about 4 mm. According to various embodiments, the chip 302 may include a silicon bulk layer, e.g. a silicon substrate or a silicon wafer, wherein the silicon bulk layer of the chip 302 may have a thickness in the range of about 10 µm to about 200 µm, e.g. about 20 µm to about 100 µm, e.g. about 40 µm to about 60 µm, e.g. about 50 µm. According to various embodiments, the chip 302 may have a thickness to be flexible, e.g. such that a bending of the chip or another mechanical deformation of the chip may not damage or break nor destroy the chip 302.

According to various embodiments, the chip 302 may include at least one metallization layer. According to various embodiments, the chip 302 may include at least one chip contact, wherein the at least one chip contact may provide a connection, e.g. an electrical connection, between the chip 302 and external devices.

According to various embodiments, the foil 304 may include or consist of any material suitable for forming an insulating foil, such as plastic material or a polymer material, e.g. polyimide. The foil 304 may also include various different materials for example arranged in different regions of the foil 304, e.g. the foil 304 may include a layer stack of material layers, including at least one of the following layer materials: a metal, a metal alloy, a polymer. According to various embodiments, the foil 304 may be a carrier 304, a substrate 304 or any other suitable flexible support structure for the chip 302. The carrier may include a metal layer cover with a polymer material, e.g. to change the mechanical properties of the carrier.

According to various embodiments, the foil 304 may have a thickness in the range of about 1 µm to about 1000 µm, e.g. about 10 µm to about 400 µm, e.g. about 40 µm to about 60 µm, e.g. about 50 µm.

According to various embodiments, as shown in FIG. 3, the foil 304 may have a lateral extension, e.g. along a direction 301, which may be equal to the lateral extension of the chip 302, such that foil 304 may completely cover a first side of the chip 302. Further, according to various embodiments, not shown, the foil 304 may have a lateral extension, e.g. along the direction 301, which may be greater than the lateral extension of the chip 302. According to various embodiments, the lateral extension of the foil 304 may protrude over the chip 302 by a distance in the range of about 1.5 mm to 12 mm, e.g. about 3 mm to about 9 mm, e.g. about 4 mm to about 6 mm, e.g. about 5 mm. Further, according to various embodiments, the foil 304 may have a lateral extension, e.g. along the direction 301, which may be smaller than the lateral extension of the chip 302.

According to various embodiments, the foil 304 may include or consist of a uniform region, e.g. having a uniform structure, and thus the foil 304 may be a single layer foil. In further embodiments, the foil 304 may include or consist of different regions, e.g. different materials, different thicknesses etc. and thus may have different physical or chemical properties within the different regions. The foil may be designed to provide an improved, e.g. optimal, carrier for the respective chip, e.g. the foil may at least include a region providing a chemical protection or a region to prevent a material diffusion through the foil, e.g. prevent the introduction of water into the foil or into the chip, wherein the foil may include another region, e.g. formed of a stable metal layer, to provide a desired mechanical stability, e.g. formed of a flexible material structure, to provide a desired flexibility against mechanical load. According to various embodiments, the foil 304 may serve as a protection structure, e.g. a protection layer, against external influences for the chip 302.

According to various embodiments, the foil 304 may be attached to the chip 302 e.g. by using an adhesive, e.g. glue, or by fusing, molding or soldering. According to various embodiments, the foil 304 may have adherent properties, e.g. being self-adherent. According to various embodiments, the foil 304 may be attached to the chip 302 or the chip 302 may be attached to the foil 304 by using a double sided adhesive structure, e.g. a double sided adhesive tape.

Figure 4:
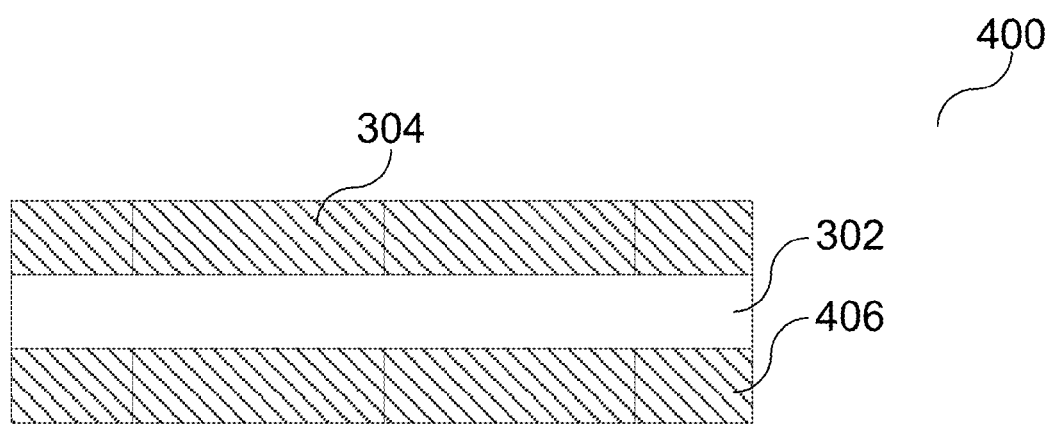
FIG. 4 shows a cross sectional view of a chip arrangement, according to various embodiments.

According to various embodiments, FIG. 4 shows a chip arrangement 400, wherein a chip 302 may be enclosed by at least two foils 304 and 406. A first foil 304 of the at least two foils may be attached to a first side of the chip 302, and a second foil 406 of the at least two foils may be attached to a second side of the chip 302. According to various embodiments, the at least two foils 304, 406 may have the same features and functionalities as the foil 304, as already described above. As shown in FIG. 4, the foil 406 may have the same shape as the foil 304, e.g. such that foils 304 and 406 may completely cover a first (main) side and a second (main) side of the chip 302 (wherein the second (main) side of the chip 302 may be opposite to the first side (main) of the chip 302). According to various embodiments, the foil 406 may have a shape which is smaller than the shape of the foil 304. Further, the foil 406 may have a shape which is larger than the shape of the foil 304. As shown in FIG. 4, the foil 406 may have the same thickness as the foil 304 as shown in FIG. 3. According to various embodiments, the foil 406 may have a thickness which is thinner than the thickness of the foil 304. Further, the foil 406 may have a thickness which is greater than the thickness of the foil 304. According to various embodiments, the foils 304 and 406 may include or consist of the same materials. The foil 406 may exclude, include or may consist of other materials than the foil 304. According to various embodiments, the foils 304 and 406 may have the same layers and regions. According to various embodiments, the foils 304 and 406 may have different layers and regions.

According to various embodiments, a chip may include an interface structure, e.g. to transfer information, e.g. data, form the chip to an external device or to transfer information, e.g. data, to the chip.

Figure 5:
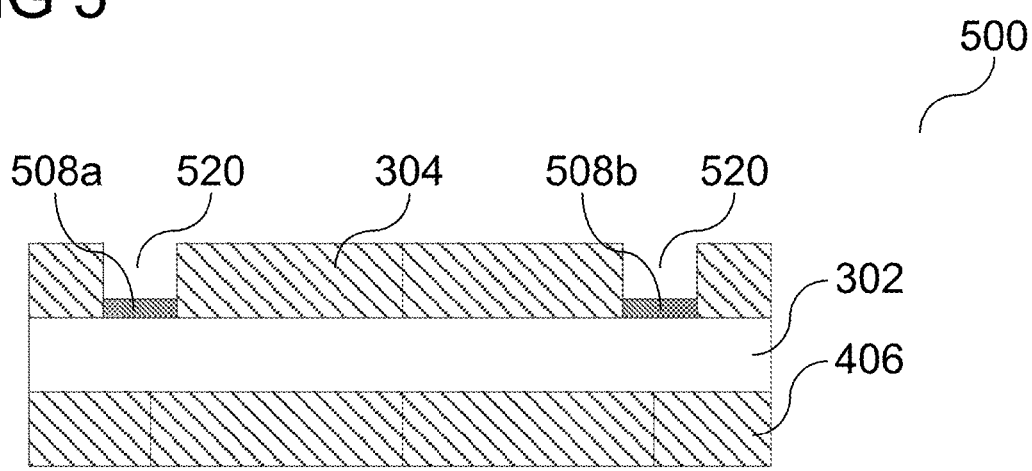
FIG. 5 shows a cross sectional view of a chip arrangement, according to various embodiments.

According to various embodiments, as shown in FIG. 5, a chip arrangement 500 may include a chip 302, a first foil 304 attached on a first side of the chip 302, a second foil 406 attached on a second side of the chip 302, and one or more contact pads 508 arranged on at least one side of the chip 302. According to various embodiments, the chip 302 and the foils 304, 406 may have the same features and functionalities as already described. According to various embodiments, the contact pads 508 may be arranged on the same side as the foil 304.

As show in FIG. 5, the chip arrangement 500 may include the chip 302, wherein the chip 302 may have two contact pads, e.g. a first contact pad 508a and a second contact pad 508b arranged on a (main) side of the chip 302. According to various embodiments, the contact pads 508a, 508b may be at least a part of an electrical contact structure or an interface, to provide an electrically conductive connection to a peripheral structure. According to various embodiments, the contact pads 508a, 508b may have an electrically conductive connection to, for example, a contact bump, as shown and described in more detail below. Furthermore, the chip 302 may have exactly one contact pad 308 or a plurality of contact pads, e.g. two contact pads; e.g. three contact pads; e.g. four contact pads; e.g. five contact pads; e.g. seven contact pads; e.g. eight contact pads; e.g. nine contact pads; e.g. ten contact pads; or even more than ten contact pads, wherein the plurality of contact pads may be arranged in columns and lines, e.g. in two columns and two lines, e.g. in two columns and three lines, e.g. in two columns and four lines, e.g. in two columns and five lines or vice versa. According to various embodiments, the contact pad 508 may include or consist of a conducting material, e.g. a metal, a metal alloy, a metallic material, a metallic compound, including at least one of Cu, Al, Au, Ag, Pt, Ti, Ni, Sn, Zn, Pb, or any non-metal electrically conducting material, e.g. graphite. The contact pad 508 may have a lateral extension in the range of about 10 µm to about 1000 µm, e.g. about 200 µm to about 800 µm, e.g. about 300 µm to about 700 µm, e.g. about 400 µm to about 600 µm, e.g. about 500 µm.

According to various embodiments, the foil 304 may have at least one recess structure 520, wherein the at least one recess structure 520 may expose the at least one contact pad 508 of the chip 302 (or e.g. may expose all contact pads 508 of the chip 302), and such that the chip may be electrically connected to a peripheral structure, e.g. to an antenna structure or a metallization structure. The at least one recess 520 may be filled with an electrically conducive material. According to various embodiments, the foil 304 may have a plurality of recesses 520, e.g. two recesses; e.g. three recesses; e.g. four recesses; e.g. five recesses; e.g. seven recesses; e.g. eight recesses; e.g. nine recesses; e.g. ten recesses; or even more than ten recesses. The number of recesses 520 may be equal to the number of contact pads 508. According to various embodiments, the lateral extension of the recess 520 positioned in the foil 304 may be larger than the lateral extension of the contact pad 508, wherein the contact pad may be completely exposed by the recess. According to various embodiments, the lateral extension of the recess 520 positioned in the foil 304 may be smaller than the lateral extension of the contact pad 508 such that the contact pad may be partially exposed by the recess. The lateral extension of the recess 520 positioned in the foil 304 may be equal to the lateral extension of the contact pad 508, wherein the contact pad may be completely exposed by the recess.

Figure 6:
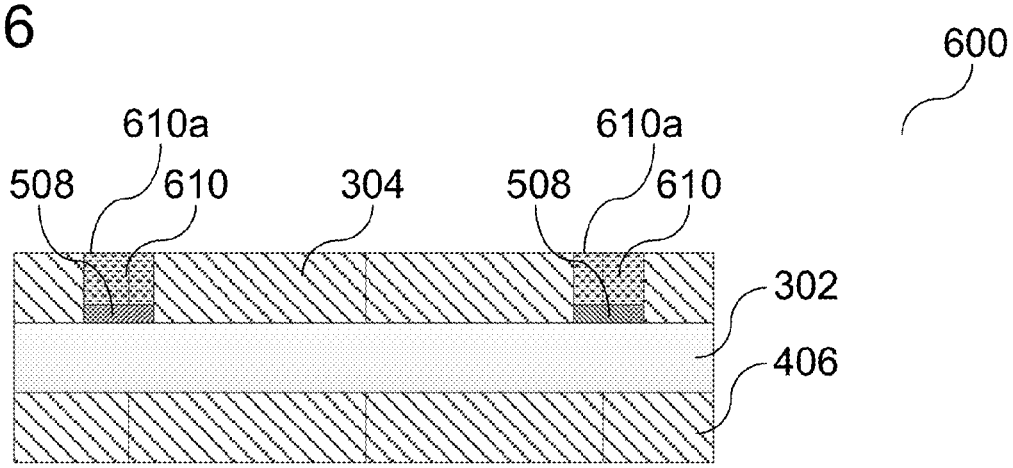
FIG. 6 shows a cross sectional view of a chip arrangement, according to various embodiments.

According to various embodiments, FIG. 6 shows a chip arrangement 600 including a chip 302, a first foil 304 attached to a first (main) side of the chip 302, a second foil 406 attached to a second (main) side of the chip 302, at least one contact pad 508, at least one recess 520 exposing the at least one contact pad, as described before, and a via structure 610, wherein the via structure 610 may be arranged within the at least one recess. According to various embodiments, the via structure 610 may include an electrically conductive material. The via structure 610 may include or consist of a conducting material, e.g. a metal, a metal alloy, a metallic material, a metallic compound, including at least one of Cu, Al, Au, Ag, Pt, Ti, Ni, Sn, Zn, Pb, or any non-metal electrically conducting material, e.g. graphite. According to various embodiments, the via structure 610 may be electrically conductively connected to the chip 302 or to the at least one contact pad 508 of the chip 302. The via structure 610 may completely fill the recess 520. The via structure 610 may partially fill the recess 520. According to various embodiments, the via structure 610 may further include an additional bump structure arranged on the upper surface 610a of the via structure 610. The via structure 610 may protrude from the foil 304, e.g. due to the additional bumps arranged on the upper surface 610a of the via structure 610.

According to various embodiments, the chip arrangement, as described herein, may provide a chip arrangement similar to a chip package, e.g. including at least a chip and a protection structure (e.g. a foil). According to various embodiments, the chip arrangement, as described herein, may provide a chip arrangement similar to a chip package, e.g. including at least a chip, a protection structure (e.g. a foil) and a metallization (e.g. electrical contacts including a contact pad 508 and a via structure 610). According to various embodiments, the chip 302 may be thin, as described, such that the chip 302 may be flexible. According to various embodiments, the foil 304 or the foils 304 and 406 may protect the chip 302 without suppressing the flexibility of the chip arrangement, such that the chip arrangement, as described herein, may withstand a mechanical load, since the chip arrangement may rather bend than break.

According to various embodiments, a chip arrangement 300, 400, 500, 600 may provide a flexible chip arrangement or a flexible chip package. According to various embodiments, the chip arrangement, as described herein, may be suitable for the use in chip cards, e.g. for the use in chip cards and in contactless chip cards.

The chip arrangement, as described herein, may have a thickness in the range of about 30 µm to about 1000 µm, e.g. about 90 µm to about 600 µm, e.g. about 120 µm to about 180 µm, e.g. about 150 µm. The thickness of the chip 302 and the thickness of the foil 304 or the foils 304 and 406 attached on the chip may be selected to provide a stable and flexible package, e.g. the chip may be very thin, as already described, and the foil or the foils attached to the chip may provide a flexible housing for the chip. The flexibility of the foils may depend on their thickness and the used material. The foil or the foils attached to the chip may also provide a chemical protection for the chip, e.g. protecting the chip from liquids.

Figure 7A:
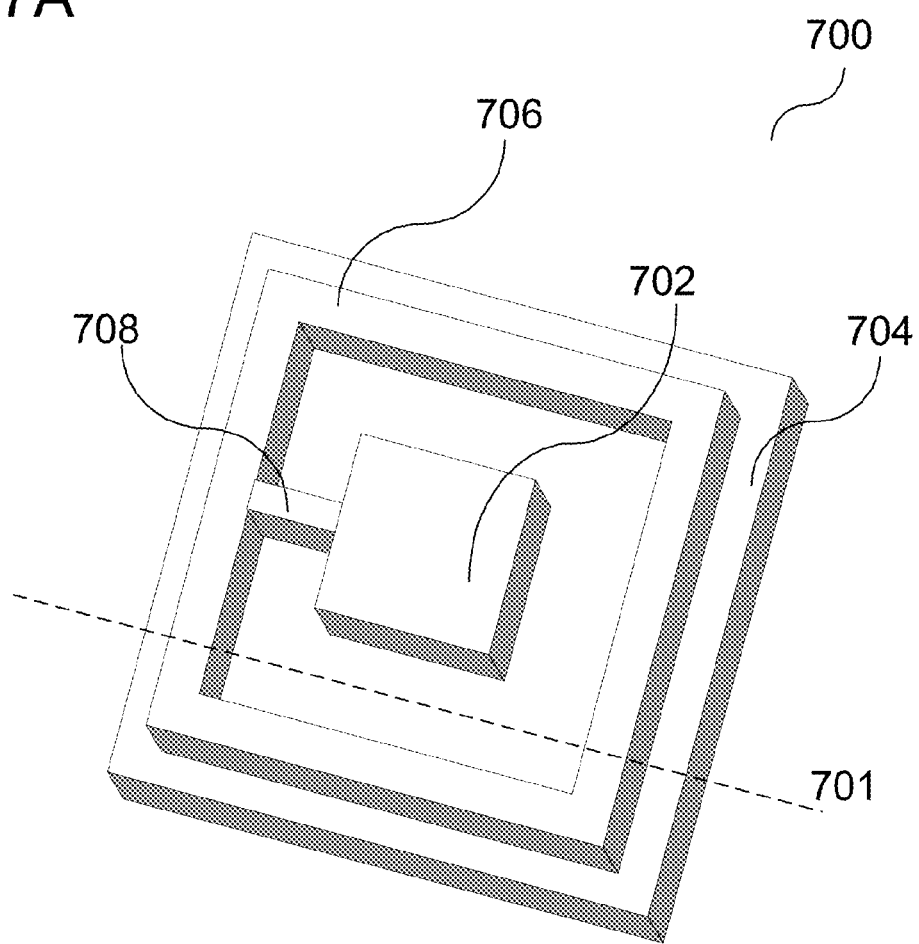
FIG. 7A schematically shows a perspective view of a chip arrangement, according to various embodiments.

According to various embodiments, FIG. 7A schematically shows a perspective view of a module 700, wherein a package 702 may be assembled on an antenna carrier 704. The package 702 may refer to the chip arrangement 600 and may have the same features and functionalities, as already described. According to various embodiments, the package 702 may be encircled by an antenna 706, wherein the antenna 706 may be attached to at least one of the front side of the antenna carrier 704 and the back side of the antenna carrier 704.

According to various embodiments, the shape of the antenna carrier 704 may be rectangular, e.g. square. According to various embodiments, the antenna carrier 704 may have dimensions in the range of about 2 mm to about 16 mm, e.g. from about 4 mm to about 12 mm, e.g. from about 5 mm to about 9 mm, e.g. about 7 mm. The antenna carrier 704 may be provided in a 35 mm standard strip size, wherein the strip may come from a roll, e.g. from a roll-to-roll process. The strip and thus also the antenna carrier 704 may include or consist of an insulating material, e.g. a plastic material, a flexible material, a polymer material, polyimide, a laminate material, silicone, rubber, ceramics, or any other material providing for example an insulting and flexible carrier. The antenna carrier may also include a substrate, a layer, a layer stack, layered regions or a support structure.

According to various embodiments, the antenna carrier 704 may include more than one type of material, e.g. a layer stack including a first layer of a first material and a second layer of a second material. The antenna carrier 704 may include a metal layer or a metal alloy layer and a polymer layer. These layers may not only be structured horizontally, but may also be structured vertically and thus, may form regions. According to various embodiments, the antenna carrier 704 may be a foil, e.g. a plastic foil or a polymer foil.

According to various embodiments, the package 702 may be attached to the antenna carrier 704 e.g. by use of an adhesive, e.g. a glue, by fusing, molding or molding. According to various embodiments, the glue structure or the solder structure may have a thickness in the range of about 1 µm to about 100 µm, e.g. about 10 µm to about 80 µm, e.g. about 30 µm to about 60 µm, e.g. about 50 µm, e.g. in a thickness equal or less than 50 µm.

According to various embodiments, the antenna 706 may encircle the package 702, furthermore, the antenna 706 may enclose the package 702, e.g. enclosing the package 702 directly. The shape of the antenna 706 may be rectangular, e.g. square. The antenna 706 may have an inside diameter in the range of about 2 mm to about 15 mm, e.g. from about 3 mm to about 9 mm, e.g. from about 4 mm to about 6 mm, e.g. about 5 mm. According to various embodiments, the antenna 706 may have a width in the range from about 0.2 mm to about 5 mm, e.g. about 0.5 mm to about 3 mm, e.g. about 0.75 mm to about 1.5 mm, e.g. about 1 mm. According to various embodiments, the antenna 706 may have a thickness in the range of about 1 µm to about 100 µm, e.g. about 5 µm to about 50 µm, e.g. about 10 µm to about 20 µm, e.g. about 15 µm. According to various embodiments, the shape of the antenna 706 may be circular, ellipsis, triangular, pentagonal or polyangular, e.g. the shape of the antenna 706 may be adapted to the shape and dimensions (e.g. the lateral extensions) of the package 702, such that the package 702 may be enclosed by the antenna 706 in every embodiment.

According to various embodiments, the antenna 706 may be made by using copper or aluminum etch technology, so that the antenna 706 may include copper or aluminum. According to various embodiments, the antenna 706 may consist of a conducting material, e.g. a metal, a metal alloy, a metallic material, a metallic compound, including at least one of Cu, Al, Au, Ag, Pt, Ti, Ni, Sn, Zn, Pb, or any non-metal electrically conducting material, e.g. graphite. According to various embodiments, the antenna 706 may include a patterned layer, e.g. a patterned metal layer, e.g. a patterned copper layer (e.g. provided by using a copper etch technology).

According to various embodiments, the configuration of antenna 706 as described before, e.g. in shape, in thickness, applied materials, applied structure may allow the antenna 706 being flexible, such that antenna 706 may withstand deformations when the antenna carrier 704 is bend, e.g. due to mechanical load.

Figure 7B:
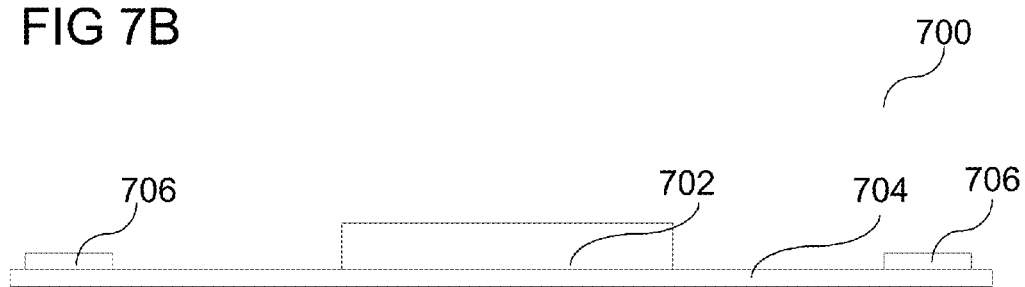
FIGS. 7B and 7C show a cross sectional view of a chip arrangement, according to various embodiments.

Regarding to FIG. 7B and in accordance with various embodiments, the antenna 706 may include or consist of a single conducting line, wherein in further embodiments, a plurality of conducting lines (which may also be referred to as conductor tracks), e.g. two lines, or a multiplicity of conducting lines, e.g. three lines or even more than three lines, may be possible, wherein the plurality respectively multiplicity of conducting lines is adjacent to each other.

According to various embodiments, the antenna 706 may be attached to the antenna carrier 704 e.g. by using an adhesive, soldering, molding, etching, and so on.

The package 702 may be attached to the antenna carrier 704, wherein the package 702 may be arranged on the same side as the antenna 706. According to various embodiments, the package 702 may be attached to the antenna carrier 704, wherein the package 702 may be arranged the side of antenna carrier 704, which is opposite the side on which the antenna 706 is attached. The antenna 706 may be connected to the package 702, e.g. electrically connected, via through holes, which may be provided in the antenna carrier 704.

Figure 7C:
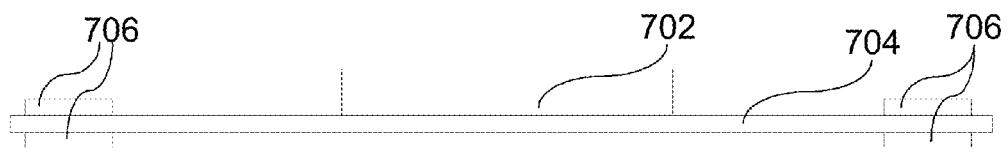

Regarding FIG. 7C and in accordance with various embodiments, the antenna 706 may include or consist of a plurality of antenna structures, e.g. two antenna structures, as described above, wherein one antenna may be attached to a first side of the antenna carrier 704 and another antenna may be attached to another side, opposite to the first (main) side, of the antenna carrier 704. According to various embodiments, the antenna carrier 704 may include at least one through hole, e.g. for connecting, e.g. electrically connecting, the package 702 with a further component, with an additional antenna.

According to various embodiments, the antenna carrier 704 may include at least one contact pad, e.g. two contact pads, e.g. three contact pads, e.g. four contact pads, e.g. five contact pads, e.g. six contact pads, e.g. seven contact pads, e.g. eight contact pads, e.g. nine contact pads, e.g. ten contact pads, or even more than ten contact pads. The antenna 706 arranged on the antenna carrier 704 may have a connection to at least one of the contact pads, e.g. an electrical connection. The antenna 706 may be electrically coupled to the package 702 via the at least one contact pad on the antenna carrier 706. According to various embodiments, the at least one contact pad may be arranged on the same side of the antenna carrier 704 as the package 702. The package 702 may have the same amount of contact pads as the antenna carrier 704, which may match in dimensions and position to the contact pads on the antenna carrier 704.

The arrangement of FIG. 7C, including or consisting of a package 702, an antenna carrier 704 and an antenna 706 may be used in various embodiments in the manufacturing of chip cards or smart cards.

According to various embodiments, the chip card to be manufactured may be a contactless chip card. The antenna 706 may be used as a booster antenna for contactless transmission of information between the chip 302 within the package 702 and a chip card main antenna.

According to various embodiments, FIG. 8 show a set of different arrangements in the fabrication of contactless chip cards, wherein in each of the arrangements the package 702, which may be fixed to the antenna carrier 704, which may contain the antenna 706, may be attached to into a chip card workpiece, e.g. a chip card inlay, in flip-chip technology. The arrangements may be attached to the chip card by using adhesive, solder, mold, and so on.

Figure 8A:
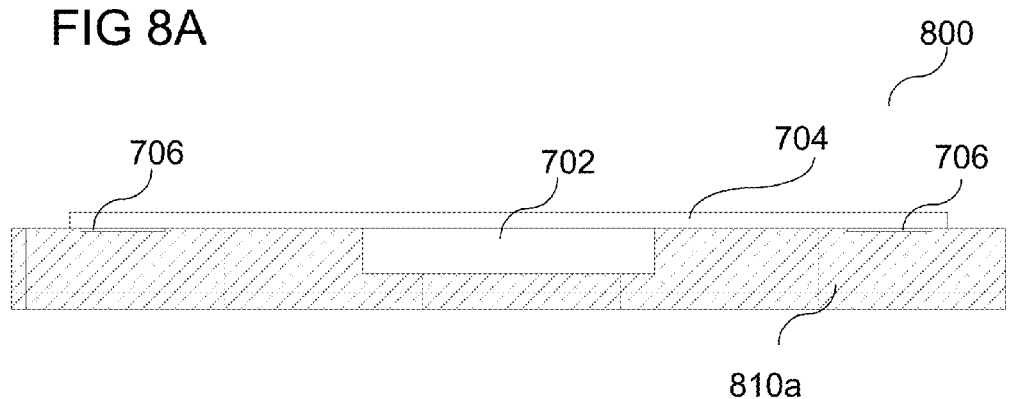
FIGS. 8A to 8F schematically show respectively a cross sectional view of a chip arrangement, according to various embodiments.

According to various embodiments, as shown in FIG. 8A, a chip card inlay 810a may comprise a cavity in which the package 702 may be fitted. The cavity within the chip card inlay 810a may be equal to the dimensions of package 702, e.g. in the dimensions of width and depth of package 702. The back side of antenna carrier 704, which is the opposite side to the side on which the package 702 is attached, may be coated with a layer 812a when the module is fitted into the chip card inlay 810a, as shown in FIG. 8C and FIG. 8E.

Figure 8B:
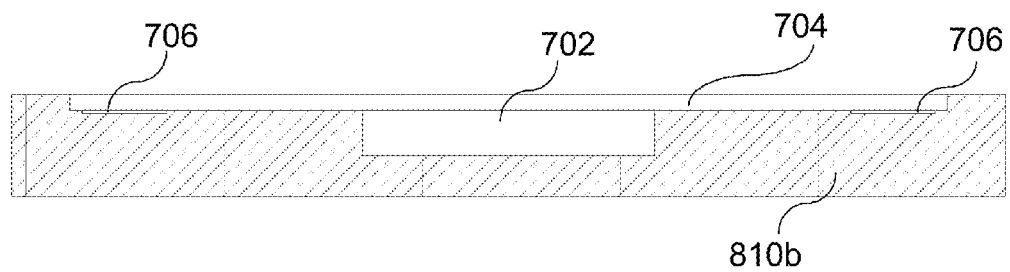
Figure 8C:
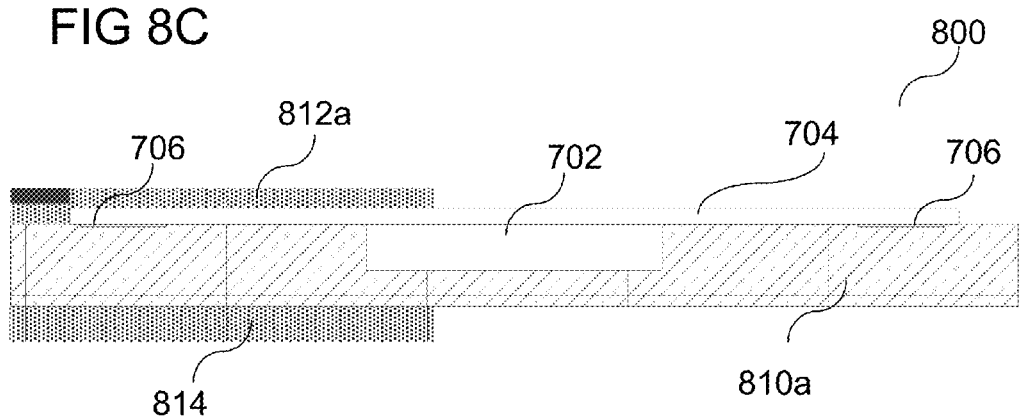
Figure 8D:
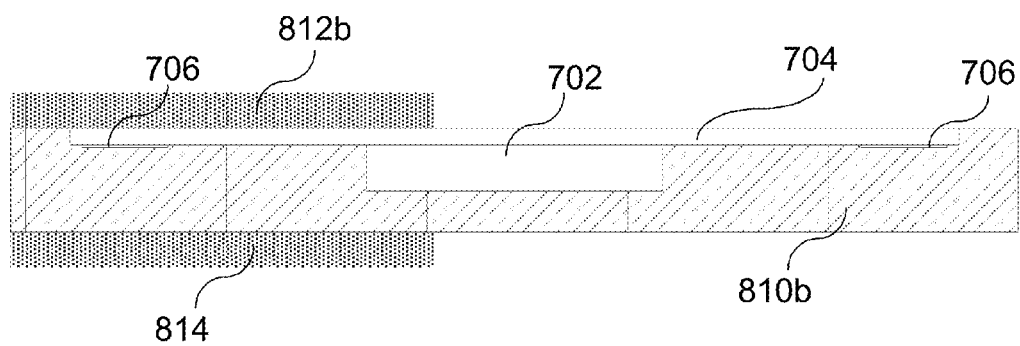
Figure 8E:
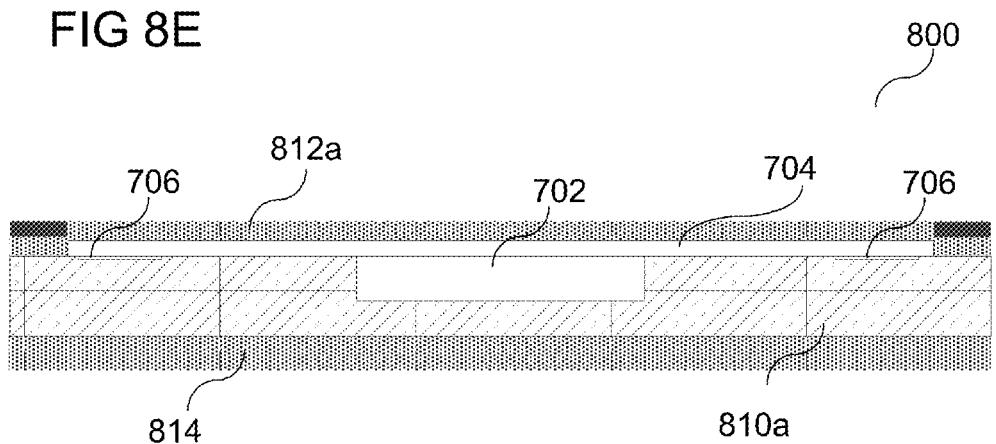
Figure 8F:
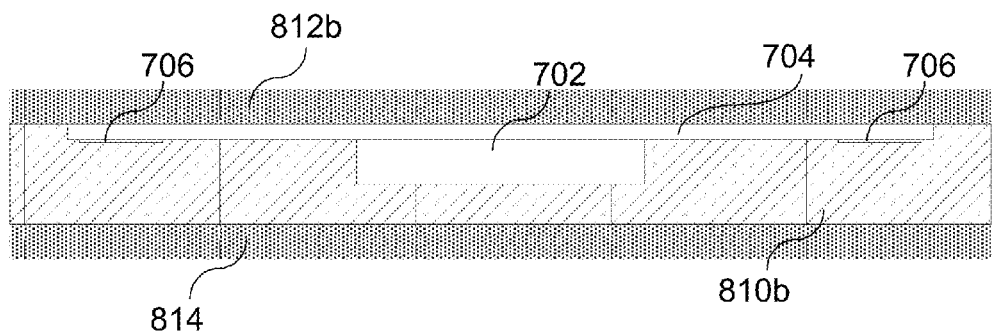

According to various embodiments, as shown in FIG. 8B, a chip card inlay 810b may include a cavity in which a module, including or consisting of the package 702, the antenna carrier 704 and the antenna 706, may be fitted. The cavity within the chip card inlay 810b may match to the dimensions of the module, e.g. in the dimensions of width and depth of the module. The back side of antenna carrier 704, which is the opposite side to the side on which the package 702 is attached, may be coated with a layer 812b when the module is fitted into the chip card inlay 810b, as shown in FIG. 8D and FIG. 8F.

The coating layers 812a, 812b may cover the back side of the antenna carrier 704 at least partially, whereby in further embodiments the coating layers 812a, 812b may cover the back side of the antenna carrier 704 completely, whereby in other embodiments the coating layers 812a, 812b may cover the back side of the antenna carrier 704 completely and further may be extended on the chip card inlay 810a, 810b.

According to various embodiments, the coating layers 812a, 812b may have a thickness in the range of about 10 μm to about 1000 μm, e.g. about 100 μm to about 600 μm, e.g. about 200 μm to about 400 μm, e.g. about 300 μm. The coating layer 812b may not have a step like the coating layer 812a may have. The coating layers 812a, 812b may include or consist of any material suitable for covering the antenna carrier 704 and its structures, e.g. an antenna 706 on the back side of the antenna carrier 704 (not shown), against external influences, e.g. mechanical stress, radiation, liquids, imprints, and so on. The coating layers 812a, 812b may consist of different regions, e.g. different materials, different thicknesses etc., and thus may have different properties within the different regions. The coating layers 812a, 812b may consist of at least one of plastics, polymers, silicone, rubber, metal, metal alloys and any combination of the above listed.

A further coating layer 814 may cover the back side of the chip card inlays 810a respectively 810b, which is opposite to the side where a module, including or consisting of a package 702, an antenna carrier 704 and an antenna 706, may be attached, at least partially, whereby in further embodiments the coating layer 814 may cover the back side of the chip card inlays 810a respectively 810b completely.

According to various embodiments, the coating layer 814 may have the same properties as the coating layers 812a, 812b, e.g. in thickness, material, regions, and so on. The coating layer 814 may have different properties than the coating layers 812a, 812b, e.g. in at least one of thickness, material, regions, and so on.

According to various embodiments, FIG. 9 show another set of different arrangements in the fabrication of contactless chip cards. Herein, the package 702, the antenna carrier 704 and the antenna 706 as well as the coating layers 812a, 812b, 814 may have the same features and functionalities as already described.

Figure 9A:
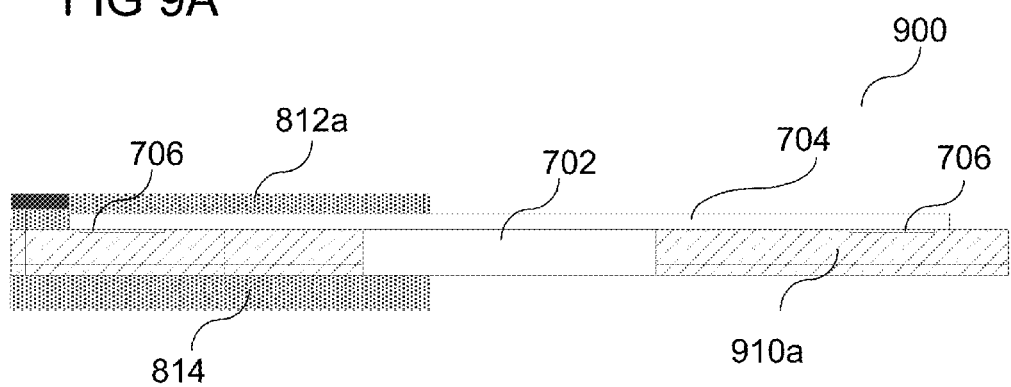
FIGS. 9A and 9B schematically show respectively a cross sectional view of a chip arrangement, according to various embodiments.

According to various embodiments, as shown in FIG. 9A, a chip card inlay 910a may comprise a recess in which the package 702 may be fitted, wherein the depth of the recess may be the total thickness of the card inlay 910a.

Figure 9B:
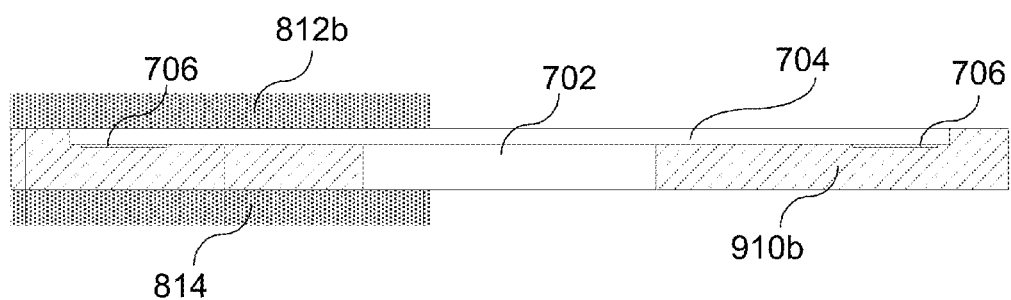

According to various embodiments, as shown in FIG. 9B, a chip card inlay 910b may comprise a recess in which a module, including or consisting of the package 702, the antenna carrier 704 and the antenna 706, may be fitted, wherein the depth of the recess may be the total thickness of the card inlay 910b.

According to various embodiments, the arrangements shown in FIG. 9A and FIG. 9B may be attached to the chip card by using adhesive, solder, mold, and so on.

According to various embodiments, the coating layer 812a, 812b may cover the back side of antenna carrier 704 at least partially, whereby in further embodiments the coating layers 812a, 812b may cover the back side of antenna carrier 804 complete, whereby in other embodiments the coating layers 812a, 812b may cover the back side of antenna carrier 704 complete and further may be extended on the chip card inlays 910a respectively 910b. Further, a coating layer 814 may cover the back side of the chip card inlays 910a respectively 910b, which is opposite to the side where the module, including or consisting of the package 702, the antenna carrier 704 and the antenna 706, may be attached, at least partially, whereby in further embodiments the coating layer 814 may cover the back side of the chip card inlays 910a, 910b completely.

According to various embodiments, a method is provided, wherein a foil may be attached to at least one side of a chip to strengthen the chip. The so strengthened chip with its at least one foil may form a package. The package may be assembled on an antenna carrier. At least one antenna may be formed within at least one side the antenna carrier, e.g. by using well known methods like Al- or Cu-Etch technology, wherein the at least one antenna may be electrically connected to the package. A module may be received, including or consisting of a package, an antenna carrier and an antenna, which may be attached to a chip card inlay for manufacturing a chip card, e.g. a contactless chip card.

FIG. 10 shows a flow diagram of a method for manufacturing a chip arrangement. The method 1000 for manufacturing a chip arrangement may include, in 1010, attaching a first foil on a first side of a chip, such that the first of the chip is protected by the first foil, in 1020, forming at least one recess in the first foil above the at least one contact pad of the chip, in 1030, filling the at least one recess in the first foil with an electrically conductive material, in 1040, attaching a second foil to a second side of the chip, such that the second side of the chip is protected by the second foil, further also forming at least one recess in the second foil and even further fill the recess with an electrically conductive material, in 1050, forming a first antenna on a first side of an antenna carrier, in 1060, forming a second antenna on a second side of the antenna carrier, in 1070, attaching a chip package on the antenna carrier and electrically connecting the chip package to at least one of the antennas, in 1080, attaching at least one coating layer to at least one side of the antenna module, in 1090, separating the antenna module from the strip.

A first foil 304 may be attached to a first side of a chip 302, as already described herein. According to various embodiments, attaching the first foil 304 to a first side of the chip 302 may include applying an adhesive, e.g. glue, or by fusing, molding or soldering. A layer of glue or solder may be formed on the first side of the chip 302 to provide an adhesion between the first side of the chip 302 and the first foil 304. Other techniques like adhesive structures, e.g. a double sided adhesive tape, or adherent properties of the first foil 304, e.g. being self-adherent, may be used for attaching the first foil 304 to the chip 302.

At least one recess 520 may be formed in the first foil 304 above the at least one contact pad 508 of the chip 302, as already described. Forming the at least one recess 520 in the first foil 304 may include techniques like etching or cutting. Forming the at least one recess 520 in the first foil 304 may include laser cutting to provide at least one recess for a connection from the chip 302 to peripheral structures.

According to various embodiments, the at least one recess 520 in the first foil 304 may be filled with an electrically conductive material 610, as already described. Filling the electrically conductive material 610 into the recess 520 may include techniques like depositing, injecting or layering. The electrically conductive material 610 may be filled into the recess 520 by using a chemical deposition process.

According to various embodiments, a second foil 406 may be attached to a second side of the chip 302. The attaching the foil 406 to the chip 302 may be similar to the process of attaching the first foil 304 to the chip 302, as already described. According to various embodiments, at least one recess be formed in the second foil 406. According to various embodiments, the method of forming the at least one recess in the foil 406 may be similar to the process of forming the at least one recess 520 in the foil 304, as already described. The at least one recess in the second foil 406 may be filled with an electrically conductive material. The method of filling the at least one recess in the foil 406 with an electrically conductive material may be similar to the process of filling the at least one recess 520 in the foil 304 with an electrically conductive material 610, as already described.

According to various embodiments, a first antenna 706 may be formed over a first side of an antenna carrier 704, as already described herein. Forming the first antenna 706 on a first side of an antenna carrier 704 may include applying at least one of a copper etch technology and an aluminum etch technology. Forming the first antenna 706 on a first side of the antenna carrier 704 may include applying a copper etch technology. The antenna 706 may be formed by covering the first side of the antenna carrier 704 at least partially with a copper layer, e.g. using a deposition process or a layering process, e.g. a physical vapor deposition or a chemical vapor deposition, and patterning the copper layer to provide a first antenna 706 on the first side of the antenna carrier 704. According to various embodiments, the antenna 706 may include or consist or at least include copper. The antenna 706 may include or consist of a multiplicity of antenna structures, e.g. a multiplicity of conducting lines, e.g. one conducting line, e.g. two conducting lines, e.g. three conducting lines, e.g. four conducting lines, e.g. five conducting lines, e.g. six conducting lines, e.g. seven conducting lines, e.g. eight conducting lines, e.g. nine conducting lines, e.g. ten conducting lines, e.g. even more than ten conducting lines, wherein the multiplicity of the conducting lines is adjacent to each other.

A second antenna 706 may be formed over a second side of an antenna carrier 704, as already described herein. The method of forming the second antenna 706 on a second side of an antenna carrier 704 may be to the process of forming the first antenna 706 on a first side of an antenna carrier 704, as already described.

According to various embodiments, a chip package 702 may be attached on the antenna carrier 704, as already described. The chip package may be attached on the same side of the antenna carrier 704 like the first antenna 706. According to various embodiments, the chip package 702 may be attached on the opposite side of the antenna carrier where the first antenna 706 is situated. The chip package 702 may be attached directly or indirectly to the antenna carrier 704, wherein directly means that the chip package 702 is attached directly to the antenna carrier 704 and indirectly implies that there may be at least one structure, e.g. a layered structure, between the chip package 702 to be attached and the antenna carrier 704. According to various embodiments, attaching the chip package 702 to the antenna carrier 704 may include at least one of a fusing process, a gluing process, a heat shrinking process and a soldering process. Attaching the chip package 702 to the antenna carrier 704 may also include the use of an additional foil structure, wherein the chip package 702 may be enclosed by the foil structure and fixed thereby, and the foil structure may be attached to the antenna carrier 704 by using at least one of a fusing process, a gluing process and a soldering process, as already described.

According to various embodiments, the lateral extension of the chip package 702 may be equal to the lateral extension of the antenna 706 on the antenna carrier 704. The lateral extension of the chip package 702 may be smaller than the lateral extension of the antenna 706 on the antenna carrier 704, as already described above.

According to various embodiments, the chip package 702 attached on the antenna carrier 704 in process 1070 may be a flexible chip package. The flexibility of the chip package 702 may depend on or defined by the structure and the materials of the chip package 702, e.g. a bulk chip or a covered chip, the thickness of the chip, the thickness of the coverings, e.g. the at least one covering foil. According to various embodiments, the chip package 702 may have a thickness in the range of about 20 µm to about 1000 µm, e.g. about 40 µm to about 500 µm, e.g. about 120 µm to about 180 µm, e.g. 150 µm.

At least one electrically conductive connection 708 between the chip package 702 and at least one of the antennas 706 may be formed, e.g. via at least one electrically conductive connection 708 between at least one contact pad 508 of the chip package 702 and at least one of the antennas 706, wherein the at least one electrical connection 708 between the chip package 702 and the first antenna 706 on the same side of the antenna carrier 704 like chip package 702 may include applying at least one of a copper etch technology and an aluminum etch technology. According to various embodiments, forming the at least one electrical connection 708 between the chip package 702 and the first antenna 706 on a first side of the antenna carrier 704 may include applying a copper etch technology. According to various embodiments, forming the at least one electrical connection 708 may include the use of a deposition process or a layering process, e.g. a physical vapor deposition or a chemical vapor deposition, and patterning the copper layer to provide at least one electrical connection 708 between the chip package 702 and the first antenna 706 on the first side of the antenna carrier 704. Forming at least one electrical connection between the chip package 702 and a second antenna 706, wherein the second antenna 706 may be situated on a second side on antenna carrier 704, as already described above, may include the use of at least one through hole, e.g. a via, in the antenna carrier 704, connecting the first side of the antenna carrier 704 with the second side of the antenna carrier 704. Forming the at least one via in the antenna carrier 704 may include techniques like etching or cutting. According to various embodiments, forming the at least one via in the antenna carrier 704 may include laser cutting to provide at least one via for at least one electrical connection from the chip package 702 to the second antenna 706 on the second side of the antenna carrier 704.

According to various embodiments, the antenna 706 and the at least one electrically conductive connection 708 may be formed in the very same process, e.g. to provide a more efficient, faster and cheaper manufacturing process. The first antenna 706 and the at least one electrically conductive connection on the first side of the antenna carrier 704 may include or consist of the same material like the second antenna 706 and the at least one electrically conductive connection on the second side of the antenna carrier 704. Further, the first antenna 706 and the at least one electrically conductive connection on the first side of the antenna carrier 704 may include or consist of different materials than the second antenna 706 and the at least one electrically conductive connection on the second side of the antenna carrier 704. Further, the first antenna 706 and the second antenna 706 may include or consist of the same material, while the at least one electrically conductive connection on the first side of the antenna carrier 704 and the at least one electrically conductive connection on the second side of the antenna carrier 704 may include or consist of different materials than first and second antenna 706.

According to various embodiments, the antenna module 700, which may include or consist of the chip package 702, the antenna carrier 704, the at least one antenna 706 and the at least one connection structure 708, may be inserted into respectively attached to a chip card workpiece, e.g. a chip card inlay in flip-chip technology, and thus forming a chip card arrangement. According to various embodiments, attaching the antenna module 700 may include e.g. a fusing process, a heat shrinking process, a molding process, a soldering process or the use of an adhesive, e.g. glue.

According to various embodiments, the chip card respectively the chip card workpiece may include or consist of at least one of plastics, thermoplastics, polymers, polyesters or polycarbonate.

As shown in FIG. 8A, the antenna module 700 may be attached to a chip card inlay 810a, wherein the chip card inlay 810a may have a cavity. The lateral extension of the cavity in the chip card inlay 810a may be bigger than the lateral extension of the chip package 702 of antenna module 700, such that the chip package 702 of the antenna module 700 fits into the cavity. The lateral extension of the cavity in the chip card inlay 810a may be equal to the lateral extension of the chip package 702 of antenna module 700, as already described, such that the chip package 702 of the antenna module 700 fits into the cavity. The cavity in the chip card inlay 810a may have a depth which may be similar to the thickness of the chip package 702, in other words, the cavity may have a depth in the range of about 20 µm to about 1000 µm, e.g. about 40 µm to about 500 µm, e.g. about 120 µm to about 180 µm, e.g. 150 µm.

As shown in FIG. 8B, the antenna module 700 may be attached to a chip card inlay 810b, wherein the chip card inlay 810b may have a cavity. The lateral extension of the cavity in the chip card inlay 810b may be bigger than the lateral extension of the antenna module 700, such that the antenna module 700 fits into the cavity completely. According to various embodiments, the lateral extension of the cavity in the chip card inlay 810b may be equal to the lateral extension of the antenna module 700, as already described, such that the antenna module 700 fits into the cavity completely. According to various embodiments, the cavity in the chip card inlay 810b may have a depth about 20 µm to about 1000 µm, e.g. about 100 µm to about 500 µm, e.g. about 150 µm to about 250 µm, e.g. 200 µm.

According to various embodiments, as shown in FIG. 8C and FIG. 8D, the attached antenna module 700 may be covered with a coating layer 812a respectively 812b. According to various embodiments, the coating layers 812a and 812b may included or consist of at least one of plastics, polymers, silicone, rubber, metal, metal alloys and any combination of the above listed. The lateral extension of the coating layers 812a and 812b may be smaller than the lateral extension of the antenna module 700, so that the antenna module may be covered partially by the coating layer. Further, the lateral extension of the coating layers 812a and 812b may be equal to the lateral extension of the antenna module 700, so that the antenna module may be covered completely by the coating layer. As shown in FIG. 8E and FIG. 8F, the lateral extension of the coating layers 812a and 812b may be bigger than the lateral extension of the antenna module 700, so that the antenna module may be covered in total by the coating layers 812a respectively 812b as well as the adjacent areas of the chip card inlays 812a respectively 812b. The coating layers 812a and 812b may have a thickness in the range of about 10 µm to about 1000 µm, e.g. about 100 µm to about 600 µm, e.g. about 200 µm to about 400 µm, e.g. about 300 µm, as already described above.

According to various embodiments, as shown in FIG. 8C to FIG. 8F, a second side of the chip card inlays 810a respectively 810b, wherein the second side is opposite to the side where the antenna module 700 is attached to, may be covered with a second coating layer 814. The coating layer 814 may include or consist of at least one of plastics, polymers, silicone, rubber, metal, metal alloys and any combination of the above listed. The coating layer 814 may include or consist of the same material as the coating layers 812a respectively 812b. According to various embodiments, the coating layer 814 may include or consist of different materials as the coating layers 812a respectively 812b. The coating layer 814 may have a thickness which may be similar to the thickness of the coating layers 812a respectively 812b. Furthermore, the coating layer 814 may have a thickness which may be differ from the thickness of the coating layers 812a respectively 812b, e.g. being smaller or bigger. The coating layer 814 may have a thickness in the range of about 10 µm to about 1000 µm, e.g. about 100 µm to about 600 µm, e.g. about 200 µm to about 400 µm, e.g. about 300 µm, as already described.

According to various embodiments, as shown in FIG. 9A, the antenna module 700 may be attached to a chip card inlay 910a, wherein the chip card inlay 910a may have a recess, wherein the depth of the recess may be the total thickness of the chip card inlay 910a. According to various embodiments, the lateral extension of the recess in the chip card inlay 910a may be bigger than the lateral extension of the chip package 702 of antenna module 700, such that the chip package 702 of the antenna module 700 fits into the recess. The lateral extension of the recess in the chip card inlay 910a may be equal to the lateral extension of the chip package 702 of antenna module 700, as already described, such that the chip package 702 of the antenna module 700 fits into the recess. The recess in the chip card inlay 910a may have a depth which may be similar to the thickness of the chip package 702, in other words, the recess may have a depth in the range of about 20 µm to about 1000 µm, e.g. about 40 µm to about 500 µm, e.g. about 120 µm to about 180 µm, e.g. 150 µm.

According to various embodiments, as shown in FIG. 9B, the antenna module 700 may be attached to a chip card inlay 910b, wherein the chip card inlay 910b may have a recess, wherein the depth of the recess may be the total thickness of the chip card inlay 910b. The lateral extension of the recess in the chip card inlay 910b may be bigger than the lateral extension of the antenna module 700, such that the antenna module 700 fits into the recess completely. The lateral extension of the recess in the chip card inlay 910b may be equal to the lateral extension of the antenna module 700, as already described, such that the antenna module 700 fits into the recess completely. The recess in the chip card inlay 810b may have a depth about 20 μm to about 1000 μm, e.g. about 100 μm to about 500 μm, e.g. about 150 μm to about 250 μm, e.g. 200 μm.

According to various embodiments, a second side of the chip card inlays 910a respectively 910b may be covered with a coating layer 814. According to various embodiments, the coating layer 814 may have the same features and functionalities as already described.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement, comprising:
   a chip; and
   an insulating foil attached directly to one of the front side of the chip and the back side of the chip, wherein the chip comprises at least one contact pad, and wherein the insulating foil comprises at least one opening to expose the at least one contact pad, and wherein the insulating foil comprises a metal layer covered with a polymer material.

2. The chip arrangement of claim 1,
   wherein the chip has a thickness of equal or less than about 100 μm.

3. The chip arrangement of claim 2,
   wherein the chip has a thickness of equal or less than about 50 μm.

4. The chip arrangement of claim 1,
   wherein the insulating foil has a thickness of equal or less than about 100 μm.

5. The chip arrangement of claim 4,
   wherein the insulating foil has a thickness of equal or less than about 50 μm.

6. The chip arrangement of claim 1, further comprising an additional insulating foil attached to the other one of the front side of the chip and the back side of the chip.

7. The chip arrangement of claim 1,
   wherein the insulating foil covers substantially the one side of the chip.

8. The chip arrangement of claim 1, wherein the at least one opening is filled with an electrically conductive material.

9. The chip arrangement of claim 1,
   wherein the insulating foil is attached to the front side or back side of the chip by an adhesive, fusing, molding or soldering.

10. The chip arrangement of claim 1,
    wherein the insulating foil comprises self-adherent properties.

11. The chip arrangement of claim 1,
    wherein the insulating foil is a carrier, a substrate or a flexible support structure for the chip.

12. A chip card, comprising:
    a chip card inlay having a cavity; and
    a chip arrangement disposed in the cavity of the chip card inlay, the chip arrangement comprising:
    a chip; and
    an insulating foil attached directly to the front side of the chip, and an insulating foil attached directly to the back side of the chip, wherein the chip comprises at least one contact pad and wherein the insulating foil comprises at least one opening to expose the at least one contact pad.

13. The chip card of claim 12, further comprising:
    a booster antenna;
    wherein the chip arrangement further comprises a chip antenna;
    wherein the chip antenna is arranged to be inductively coupled to the booster antenna.

14. The chip card of claim 12, further comprising an antenna carrier having a first side and a second side opposite the first side, wherein the second side of the antenna carrier is attached to a side of the chip arrangement facing a way from the chip card inlay, wherein an antenna is attached to at least one of the first side and second side of the antenna carrier.

15. The chip card of claim 14, wherein the antenna carrier and the antenna are accommodated in the cavity.

16. A method for manufacturing a chip card arrangement, the method comprising:
    forming an antenna over at least a first side of a carrier;
    attaching a flexible chip arrangement on the carrier, wherein the flexible chip arrangement comprises:
    a chip; and
    an insulating foil attached directly to one of the front side and the back side of the chip, wherein the chip comprises at least one contact pad and wherein the insulating foil comprises at least one opening to expose the at least one contact pad, and wherein the insulating foil comprises a metal layer covered with a polymer material.

17. The method of claim 16,
    wherein forming the antenna over at least a first side of a carrier comprises applying at least one of a copper etch technology and an aluminum etch technology.

18. The method according to claim 16,
    wherein forming the antenna over at least a first side of a carrier comprises forming an antenna over the carrier, wherein the carrier has a thickness equal or less than about 100 μm.

19. The method of claim 16,
    wherein attaching the flexible chip arrangement on the carrier comprises attaching a flexible chip arrangement having a thickness equal or less than 50 μm.

20. The method of claim 16,
    wherein attaching the flexible chip arrangement on the carrier further comprises forming an electrically conductive connection between the chip and the antenna.

21. The method of claim 16, further comprising:
    forming an additional antenna being arranged on a second side of the carrier opposite to the first side of the carrier.

22. The method of claim 16,
    wherein the carrier is processed in a reel to reel system.

23. A chip card, comprising:
    a carrier; and
    a chip arrangement comprising:
    a chip; and
    an insulating foil attached directly to one of the front side of the chip and the back side of the chip, wherein the chip comprises at least one contact pad and wherein the insulating foil comprises at least one opening to expose the at least one contact pad, and wherein the insulating foil comprises a metal layer covered with a polymer material.

* * * * *